United States Patent [19]
Banakis et al.

[11] Patent Number: 5,352,125
[45] Date of Patent: Oct. 4, 1994

[54] ANTI-WICKING ELECTRICAL CONNECTOR

[75] Inventors: Emanuel G. Banakis, Naperville; Donald J. Brinkman, Woodridge; Charles Galauner, St. Charles; Irvin R. Triner, Willow Springs, all of Ill.

[73] Assignee: Molex Incorporated, Lisle, Ill.

[21] Appl. No.: 1,880

[22] Filed: Jan. 8, 1993

[51] Int. Cl.⁵ ............................................... H01R 9/09
[52] U.S. Cl. ........................................ 439/83; 439/78
[58] Field of Search ...................... 439/70, 71, 72, 74, 439/75, 78, 83, 876

[56] References Cited

U.S. PATENT DOCUMENTS

| | | | |
|---|---|---|---|
| 3,663,931 | 5/1972 | Brown | 439/75 |
| 5,131,853 | 7/1992 | Meyer | 439/82 |
| 5,137,462 | 8/1992 | Casey et al. | 439/74 |
| 5,152,702 | 10/1992 | Pilny | 439/876 |

FOREIGN PATENT DOCUMENTS 3246876 11/1991 Japan .

*Primary Examiner*—Khiem Nguyen
*Attorney, Agent, or Firm*—A. A. Tirva

[57] ABSTRACT

An electrical connector assembly is disclosed, along with a method of fabricating the assembly, wherein a dielectric housing has a lower face for mounting on a top surface of a printed circuit board. The housing includes at least one terminal-receiving cavity having an opening in the lower face of the housing. A terminal includes a receptacle portion received in the cavity for mating with a complementary electrical component. The terminal has a solder tail portion projecting from the receptacle portion, past the opening of the cavity, into a hole in the printed circuit board. The receptacle portion of the terminal is located in the cavity spaced from said opening a distance sufficient to prevent solder material from wicking up the solder tail onto the receptacle portion when the solder tail portion is wave soldered from a bottom surface of the printed circuit board.

4 Claims, 2 Drawing Sheets

ANTI-WICKING ELECTRICAL CONNECTOR

FIELD OF THE INVENTION

This invention generally relates to the art of electrical connectors and, particularly, to an electrical connector assembly which prevents wicking of solder material from a solder tail of a terminal to a receptacle portion of the terminal, along with a method of fabricating the assembly.

BACKGROUND OF THE INVENTION

Many electrical connectors are of a general type commonly called vertical-mount connectors, wherein the connectors are mounted to a surface of a printed circuit board. The connectors mount terminals which often have solder tail portions projecting from a lower face of a connector housing and into respective holes in a printed circuit board for soldering to circuit traces on the board and/or in the holes. The connectors often are mounted to a top surface of the board, and the terminals are wave soldered from a bottom surface of the board.

Various systems have been used to prevent "wicking" of the solder material up the solder tails and into the connector where the solder material will contaminate contact portions of the terminals, such as receptacle portions of the terminals, and interfere with proper interconnections between the terminals and other electrical components, such as male terminals inserted into the receptacle portions. For instance, predetermined areas of the terminals, such as between the solder tail portions and the contact portions thereof, have been selectively plated with materials which do not adhere to the solder material, or "repels" the solder material, whereby the solder material cannot migrate up the terminals and contaminate the contact portions.

Other approaches have included mounting the contact portions of the terminals in cavities of the connector housing and using plugs or other barriers to close bottom openings to the cavities, whereby the solder material cannot contaminate the terminal contact portions. Both the selective plating and the plug or barrier solutions to the wicking problem are relatively expensive procedures or constructions, particularly in compact high density connectors used in miniaturized electronic circuitry. In addition, plugs or barriers may cause other problems because they seal-off lower ends of the terminal-receiving cavities wherein contaminating moisture can accumulate.

An example of a connector construction in which wicking is quite prevalent is a connector which includes a dielectric housing mounted to a surface of a printed circuit board. The housing includes a plurality of cavities mounting receptacle-type contact portions of a plurality of terminals. Solder tails project from the receptacle portions of the terminals, past openings of the cavities at the bottom of the housing, and into plated through holes in a printed circuit board. The receptacle or contact portions are adapted to receive male terminals or other complementary mating electrical components. For instance, the receptacle portions of the terminals may have a generally box-like configuration in cross-section. The solder material has a tendency to wick up the terminals and upwardly along the receptacle portions in a "chimney" affect. During a wave soldering operation, the solder material has a tendency to be pulled up the terminal by the cleaners and fluxes used in the processes, particularly where the holes in the printed circuit board are through plated. For some years, wave soldering of these connector designs have employed Halogens as cleaners and fluxes which are controllable to a degree by the aforesaid selective plating processes or the use of anti-wicking plugs or barriers which, again, are quite expensive systems.

Today, for environmental reasons, there is a trend or movement away from the use of Halogens as cleaners and fluxes, and to the use of new types of organic chemicals which are much more active (i.e. more acidic) but which have magnified the solder wicking problem, because these chemicals attract the solder material to a greater extent than Halogens. Therefore, there is a need for a much more simple solution to the anti-wicking problem than that afforded by expensive selective plating procedures and plug or barrier constructions. This invention is directed to satisfying that need and solving the problems outlined above.

SUMMARY OF THE INVENTION

An object, therefore, of the invention is to provide a new and improved anti-wicking electrical connector assembly, along with a method of fabricating the assembly.

In the exemplary embodiment of the invention, an electrical connector assembly includes a dielectric housing having a lower face for mounting on a top surface of a printed circuit board. The housing includes a terminal-receiving cavity having an opening in the lower face of the housing. A terminal includes a receptacle portion received in the cavity for mating with a complementary electrical component. The terminal has a solder tail portion projecting from the receptacle portion, past the opening of the cavity, into a hole in the printed circuit board.

The invention contemplates that the receptacle portion of the terminal be located in the cavity of the housing spaced from the opening to the cavity a distance sufficient to prevent solder material from wicking up the solder tail portion onto the receptacle portion when the solder tail portion is wave soldered from a bottom surface of the printed circuit board. This simple structural combination obviates the need of employing expensive selective plating processes of the terminal or using expensive and problematic plugs or barriers which close off the terminal-receiving cavity.

As disclosed herein, the receptacle portion of the terminal is generally box-shaped in construction which, without the simple connector assembly of the invention, is highly susceptible to solder wicking by a chimney affect.

The invention also contemplates a method of fabricating an electrical connector assembly of the character described.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
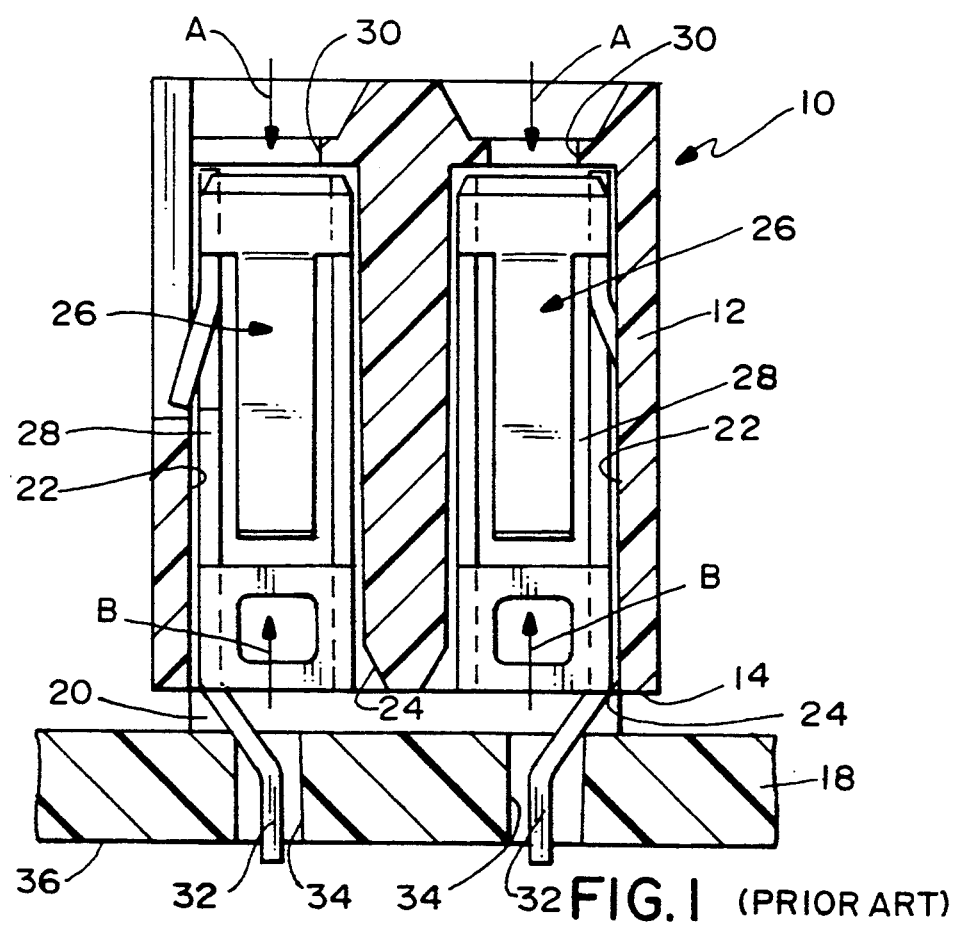
FIG. 1 is a section through an electrical connector assembly of the prior art.

Referring to the drawings in greater detail, and first to FIG. 1, an electrical connector assembly, generally designated 10, is illustrated according to the prior art. The connector includes a dielectric housing 12 having a lower face 14 for mounting on a top surface 16 of a printed circuit board 18. The housing may have some sort of stand off flanges or feet 20 projecting beyond lower face 14 to space the housing above top surface 16 of the printed circuit board. The housing includes a plurality of terminal-receiving cavities 22 having respective openings 24 in lower face 14 of the housing.

At this point, it should be understood that such terms as "upper", "lower", "top", "bottom", and the like, are being use herein and in the claims hereof simply to provide a clear and concise understanding of the invention as represented in the depictions of the drawings. However, it must be understood that such terms are not to be construed as limiting, because electrical connector assembly 10 can be used in an omni-directional manner in actual practice, as is known in the art of printed circuit board technology.

Still referring to the prior art connector assembly 10 of FIG. 1, a plurality of terminals 26 include respective receptacle portions 28 received in respective ones of cavities 22 in housing 12 for mating with complementary electrical components, such as male terminal pins inserted into the respective receptacle portions through upper openings 30 in the housing in the direction of arrows "A". In assembly, box-shaped receptacle portions 28 of the terminals are inserted into cavities 22 through openings 24 in lower face 14 of the housing, as in the direction of arrows "B".

Each terminal 26 in FIG. 1 includes a solder tail portion 32 projecting from one side of receptacle portion 28, past opening 24 of its respective cavity 22, and into a respective hole 34 in printed circuit board 18. The inside of the hole often is through-plated. Appropriate mounting means, such as conventional mounting pegs or board-locks (not shown), may be integrally molded with housing 12 and extend through appropriate holes in the printed circuit board for retaining the connector assembly to the printed circuit board during a soldering operation.

During soldering, solder tail portions 32 of terminals 26 are applied with fluxes and cleaners before soldering. Heretofore, Halogens have been used primarily as cleaners and fluxes. During wave soldering of solder tails 32 from a bottom surface 36 of printed circuit board 18, the solder material wicks up solder tail portions 32, above top surface 16 of the printed circuit board, and onto the box-shaped receptacle portions 28 of terminals 26. This is particularly true because the receptacle portions extend all the way or close to the bottom of cavities 22, at openings 24 of the cavities, i.e. the receptacle portions extend substantially to lower face 14 of housing 12. The housing could be spaced a greater distance from top surface 16 of the printed circuit board by enlarging stand-offs 20. However, this increases the overall envelope or dimensions of the connector/printed circuit board assembly, which is highly undesirable in compact integrated circuit applications. Therefore, selective plating of the solder tail portions or plugging of openings 24 to cavities 22 have been used as anti-wicking schemes, both approaches being expensive and/or problematic, as described above. These problems are magnified with the present trend away from the use of Halogens as cleaners and fluxes, to more active organic chemicals which have a greater tendency to attract the solder material above top surface 16 of printed circuit board 18 and onto receptacle portions 28 of terminals 16 at openings 24 to cavities 22.

Figure 2:
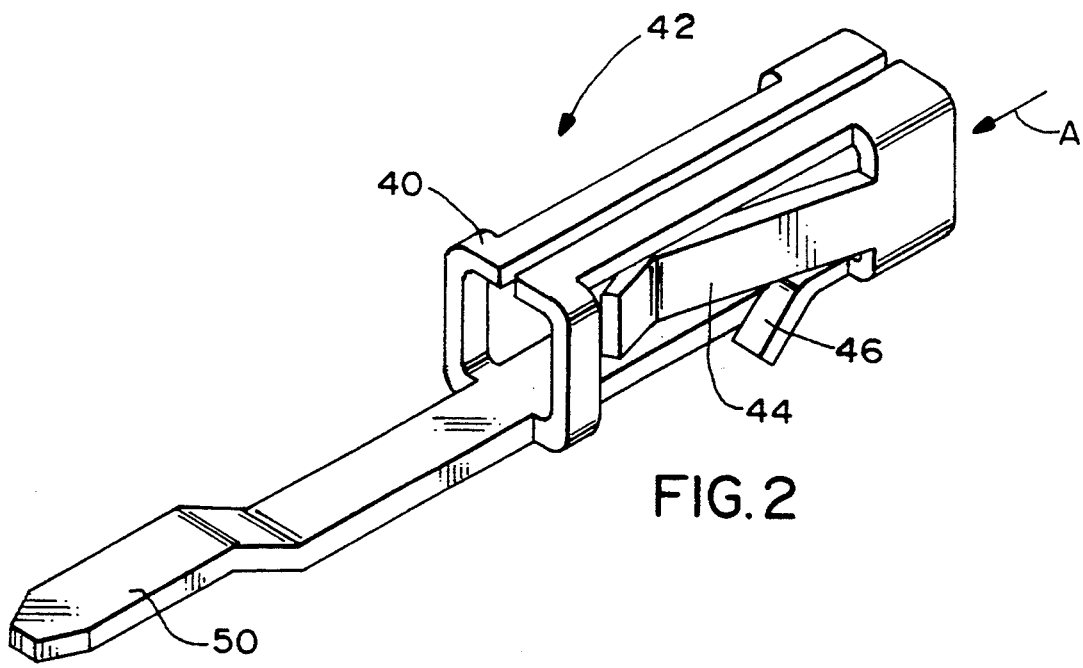
FIG. 2 is a perspective view of a terminal fabricated according to the invention.
Figure 3:
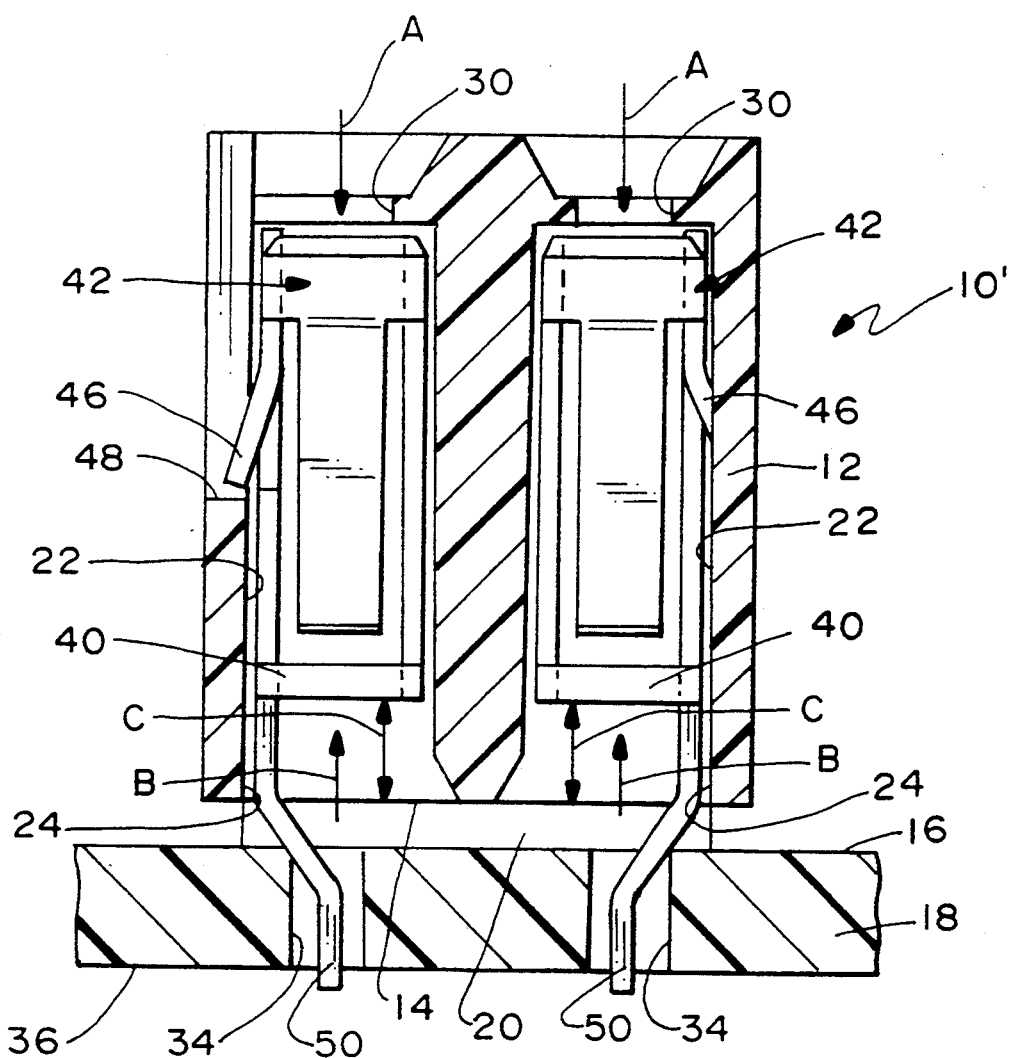
FIG. 3 is a section through an electrical connector assembly, similar to that shown in FIG. 1, but employing the concepts of the invention.

Referring to FIGS. 2 and 3, the invention is embodied in an electrical connector assembly, generally designated 10', which is soldered to printed circuit board 18. Connector assembly 10' (FIG. 3) includes a dielectric housing 12 which is identical to the housing shown in FIG. 1 and described above. Consequently, like reference numerals have been applied in FIG. 3 corresponding to like components or portions of housing 12 and printed circuit board 18 in FIG. 3. More particularly, each cavity 22 in housing 12 (FIG. 3) mounts a receptacle portion 40 of a terminal, generally designated 42 (FIG. 2). Each terminal is stamped and formed from sheet metal material and receptacle portion 40 is generally box-shaped for receiving a complementary electrical component inserted into the receptacle portion, again in the direction of arrow "A". For instance, receptacle portion 40 may include a pair of cantilevered contact spring arms 44 projecting inwardly of the terminal for engaging a complementary contact pin. The receptacle portion also may include an outwardly directed locking tab 46 for snapping behind a locking shoulder 48 (FIG. 3) of housing 12 when the terminal is inserted into its respective cavity 22 in the direction of arrow "B". These features also are present in terminals 26 (FIG. 1) and, like terminals 26, terminals 42 include solder tail portions 50 projecting from receptacle portions 40, past openings 24 of cavities 22 in lower face 14 of the housing, and into holes 34 in printed circuit board 18.

Referring particularly to FIG. 3, the invention contemplates that receptacle portions 40 of terminals 42 be constructed considerably shorter than receptacle portions 28 of terminals 26 of the prior art shown in FIG. 1. The affect of this construction is to space the receptacle portions considerably inwardly of openings 24 to cavities 22 and above lower face 14 of housing 12 which, in turn, spaces the receptacle portions considerably further from top surface 16 of printed circuit board 18. This inward spacing of the receptacle portions of the terminals has proven effective to prevent solder material from wicking all the way up solder tail portions 50 which now are considerably longer than solder tail portions 32 of terminals 26 (FIG. 1).

In assembly of connector 10' (FIG. 3), terminals 42 are inserted through openings 24 in lower face 14 of housing 12, into cavities 22, in the direction of arrows "B", until locking tabs 46 snap behind shoulders 48 of the housing. This spaces receptacle portions 40 a distance "C" above lower face 14 of the housing and may be on the order of between 0.015 and 0.045 inch in miniature connectors. The connector assembly then is mounted to top surface 16 of printed circuit board 18 by inserting solder tail portions 50 into holes 34 of the board. As stated above, appropriate conventional mounting pegs or boardlocks may be employed to retain the connector assembly surface mounted to the board. The solder tail portions have been applied with organic chemical cleaners and fluxes, such as a material available as Organo Flux ™ 3355-11, manufactured by London Chemical Company. This material generally is a composition of isopropyl alcohol and hexyleneglycol. The assembly then is wave soldered from bottom surface 36 of printed circuit board 18 at a temperature on the order of 500° F. and at a wave pressure on the order of 3.8 psi, and the solder material follows or is pulled up through holes 34 in the board to top surface 16 of the board. However, because of spacing "C" between receptacle portions 40 of terminals 42 and the lower face 14 of housing 12, along with the corresponding increased length of solder tail portions 50, the solder material cannot wick all the way up to the receptacle portions where the solder material would contaminate the terminals and/or interfere with their electrical interconnecting functions. Changing the soldering parameters can change or reduce the wicking affect of the solder material. However, changes in the temperature and/or pressure parameters often result in an increase in defective solder joints. For instance, it has been found that reducing the temperature to 450° F., while reducing the wicking problems, results in as much as a 20% increase in defective solder joints. Therefore, the invention enables the fabrication of substantially 100% sound joints using optimum parameters.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In an electrical connector assembly which includes a dielectric housing having a lower face for mounting on a top surface of a printed circuit board, the housing including at least one terminal-receiving cavity having an opening with the same cross-sectional area as the cavity in the lower face of the housing, a terminal including a receptacle portion received in the cavity for mating with a complementary electrical component, the terminal including a solder tail portion projecting from the receptacle portion past the opening of the cavity into a hole in the printed circuit board, said solder tail having at least a portion coated with organic flux-/cleaner material composed generally of isopropyl alcohol and hexylene glycol, wherein the improvement comprises said receptacle portion of the terminal being located in the cavity spaced from said opening a distance greater than 0.015 inch to prevent solder material from wicking up the solder tail portion onto the receptacle portion when the solder tail portion is wave soldered from a bottom surface of the printed circuit board.

2. In an electrical connector assembly as set forth in claim 1 wherein said receptacle portion of the terminal is generally box-shaped in construction.

3. In an electrical connector assembly as set forth in claim 2 wherein the solder tail portion of the terminal projects from the box-shaped receptacle portion at one side of the cavity.

4. In an electrical connector assembly as set forth in claim 1 wherein the receptacle portion of the terminal is spaced from said opening on the order of 0.045 inch.

* * * * *